United States Patent [19]

Hyodo

[11] 4,366,435

[45] Dec. 28, 1982

[54] POWER SUPPLY UTILIZING A THYRISTOR

[75] Inventor: Kouichi Hyodo, Chofu, Japan

[73] Assignee: Tokyo Shibaura Denki Kabushiki Kaisha, Kawasaki, Japan

[21] Appl. No.: 231,352

[22] Filed: Feb. 4, 1981

Related U.S. Application Data

[63] Continuation-in-part of Ser. No. 35,073, May 1, 1979, abandoned.

[30] Foreign Application Priority Data

May 8, 1978 [JP] Japan .................................. 53-53744
Apr. 30, 1979 [GB] United Kingdom ................. 7914929
May 3, 1979 [AU] Australia ............................ 46652/79
May 3, 1979 [DE] Fed. Rep. of Germany ....... 2917884
May 8, 1979 [CA] Canada ................................. 327157

[51] Int. Cl.³ ...................... G01R 31/22; G01R 25/00
[52] U.S. Cl. ........................... 324/158 SC; 324/83 A; 363/128; 368/118

[58] Field of Search ............... 324/158 SC, 83 A, 102, 324/83 D; 368/121, 118; 363/129, 128

[56] References Cited

U.S. PATENT DOCUMENTS 3,413,544 11/1968 Jotten et al. ......................... 368/121
4,167,698 9/1979 Podlewski ..................... 324/158 SC Primary Examiner—Ernest F. Karlsen
Attorney, Agent, or Firm—Stevens, Davis, Miller & Mosher

[57] ABSTRACT

In apparatus for supplying an electric power from a power source to a load through a thyristor, an ignition phase angle of which is controlled by a conduction control circuit through an ignition instruction generating circuit, there are provided a circuit for detecting voltage applied across the thyristor, another circuit for converting the detected voltage into a conduction completion phase angle, and still another circuit for displaying a conduction completion phase angle as well as the aforementioned ignition phase angle of the thyristor.

7 Claims, 9 Drawing Figures

(a) POWER SOURSE VOLTAGE (b) CURRENT (c) THYRISTER VOLTAGE (d) OUTPUT OF RECTIFIER (e) OUTPUT OF SINGLE SHOT MULTIVIBRATOR

POWER SUPPLY UTILIZING A THYRISTOR

CROSS-REFERENCE TO RELATED APPLICATION

This application is a continuation-in-part of my copending application Ser. No. 35,073 filed May 1, 1979 now abandoned.

BACKGROUND OF THE INVENTION

This invention relates to a thyristor controlled power supplying apparatus, and more particularly to a type thereof including a device for displaying an ignition phase angle and a conduction completion phase angle of thyristors, the ignitions of which are controlled equiangularly for controlling the current supplied from a power source to a load through the thyristors.

Various power supplying apparatus are known in the art wherein a number of thyristors are phase controlled for controlling the load current. In these apparatus, when each of the thyristors is in a conductive state throughout one-half cycle, that is when the ignition phase angle is equal to zero, the ignition phase angle cannot be advanced any more than the conduction completion phase angle of the immediately preceding half cycle (such a condition is hereinafter termed fully conductive state).

Furthermore, while a thyristor in the fully conductive state has an ample margin of 180° in retarding the ignition phase angle, a thyristor operating at an ignition phase angle of nearby 180° has almost no margin for a further retard of the ignition phase angle.

Accordingly, for an appropriate control of the ignition phase angle of the equiangularly operated thyristors, it is essential to know an actual ignition phase angle and a conduction completion phase angle all the time.

SUMMARY OF THE INVENTION

A primary object of the present invention is to provide a thyristor controlled power supplying apparatus including a device for displaying the ignition phase angle and the conduction completion phase angle precisely and in a simple manner.

A further object of the present invention is to provide a thyristor controlled power supplying apparatus including a device for displaying the ignition phase angle and the conduction completion phase angle in a decimal manner or in degrees.

According to the present invention, there is provided a device for displaying ignition phase angle and conduction completion phase angle of a thyristor which is controlled by the output of a conduction control circuit to apply electric power from a power source to a load beginning at a predetermined ignition phase angle of the electric power, the device comprising:
  means for detecting the conducting state of the thyristor;
  means responsive to the conducting state detecting means for detecting the phase angle of the electric power at which completion of conduction of the thyristor occurs; and,
  means responsive to the output of the control circuit and to the output of the phase angle detecting means for converting the outputs into signals indicative of the ignition phase angle and the conduction completion phase angle and for displaying the signals indicating the ignition phase angle and the conduction completion phase angle.

Preferably, the control circuit is made to respond to the output of the conduction completion phase angle detecting means to ensure that the ignition phase angle does not lead the conduction completion phase angle of an immediately preceding half cycle of the electric power source.

Alternatively, the device further comprises an oscillator and a counter for counting the number of the output pulses from the oscillator for a period starting from the delivery of an ignition instruction from the conduction control circuit and ending at the termination of the conduction of the thyristor. The outputs of the counter and the conduction control circuit are applied to the phase displaying means to enable it to display the duration between the ignition phase angle and the conduction completion phase angle.

BRIEF DESCRIPTION OF THE DRAWINGS

In the accompanying drawings which show various embodiments of this invention.

DESCRIPTION OF THE PREFERRED EMBODIMENTS

Figure 1:
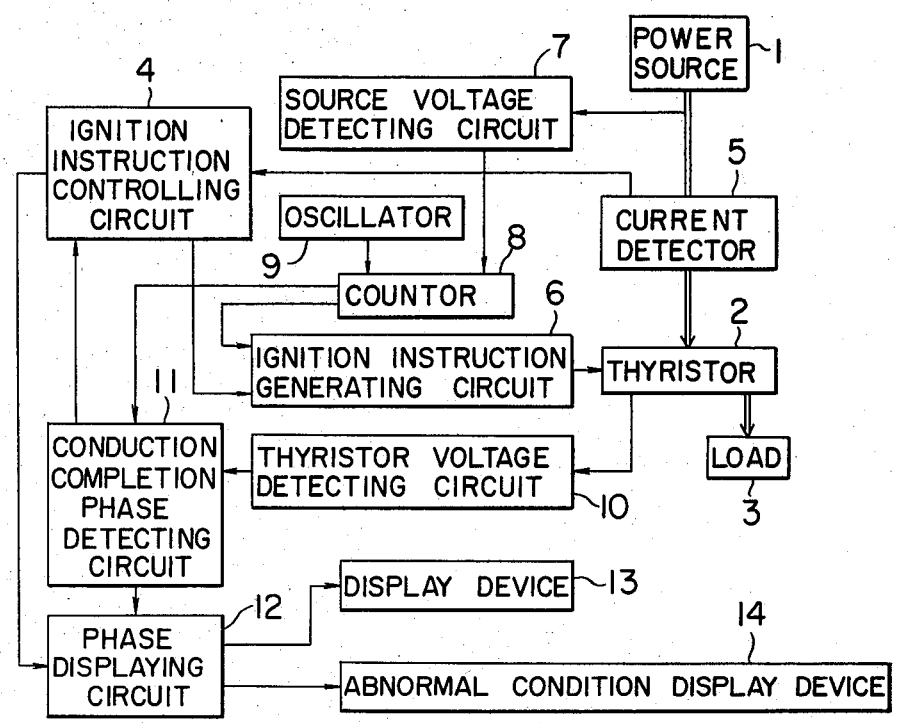
FIG. 1 is a block diagram showing an embodiment of the present invention.

Referring now to FIG. 1, there is illustrated a preferred embodiment of the present invention, in which the current supplied from a power source 1 to a load 3 is controlled by controlling the ignition phase angle of thyristors 2 operated at an equal phase angle.

In this embodiment, a current detector 5 always monitors the current supplied from the power source 1 to the load 3 through the thyristors 2, and sends out an output to an ignition instruction control circuit (or conduction control circuit) 4. The ignition instruction control circuit 4 thus finds out required advance or delay of the ignition phase angle, and controls an ignition instruction generating circuit 6 to generate a required instruction.

Simultaneously, a power-source voltage detecting circuit 7 constantly surveys the power source voltage, and delivers a signal synchronized with the power source voltage to a counter 8. The counter 8 counts the number of pulses generated from an oscillator 9 under the control of the synchronizing signal delivered from the detecting circuit 7 for indicating the phase angle at an instant of the power source. The ignition instruction generating circuit 6 compares the output of the ignition instruction control circuit 4 with the output of the phase indicative counter 8, and delivers an ignition instruction to the thyristors 2 at an appropriate time instant.

A thyristor voltage detecting circuit 10 detects the voltage across the thyristors 2. Since the voltage across the thyristors 2 rises from 0 to the power source voltage when the conduction of the thyristors 2 terminates, the thyristor voltage detecting circuit 10 delivers at this instant an output to a conduction completion detecting circuit 11. The circuit 11 determines the conduction completion phase angle from the output of the thyristor voltage detecting circuit 10 and from the count of the counter 8 indicative of the phase of the power source voltage. Upon reception of the conduction completion phase angle, the ignition instruction control circuit 4 controls the delivery of the ignition instruction signal in a manner such that the ignition phase angle does not lead the conduction completion phase angle in the immediately preceding half cycle.

A phase display circuit 12 converts the ignition instruction controlling signal from the ignition instruction control circuit 4 and the conduction completion signal from the conduction completion detecting circuit 11 into signals of a suitable form, and sends out these signals to a display device 13.

If the phase displaying circuit 12 detects an abnormal condition of the ignition phase angle or the conduction completion phase angle, the abnormal condition is displayed in an abnormal condition displaying device 14.

The above described conversion of the two signals in the phase displaying circuit 12 may be of a decimal form on the assumption that one half cycle is represented by a predetermined number, or in degrees by representing one cycle by 360°.

The above described abnormal conditions to be displayed in the device 14 may include conditions such as a too narrow phase difference between the ignition phase angle and the conduction completion phase angle, and an excessive delay of the ignition phase angle (toward the 180° phase position).

Figure 6:
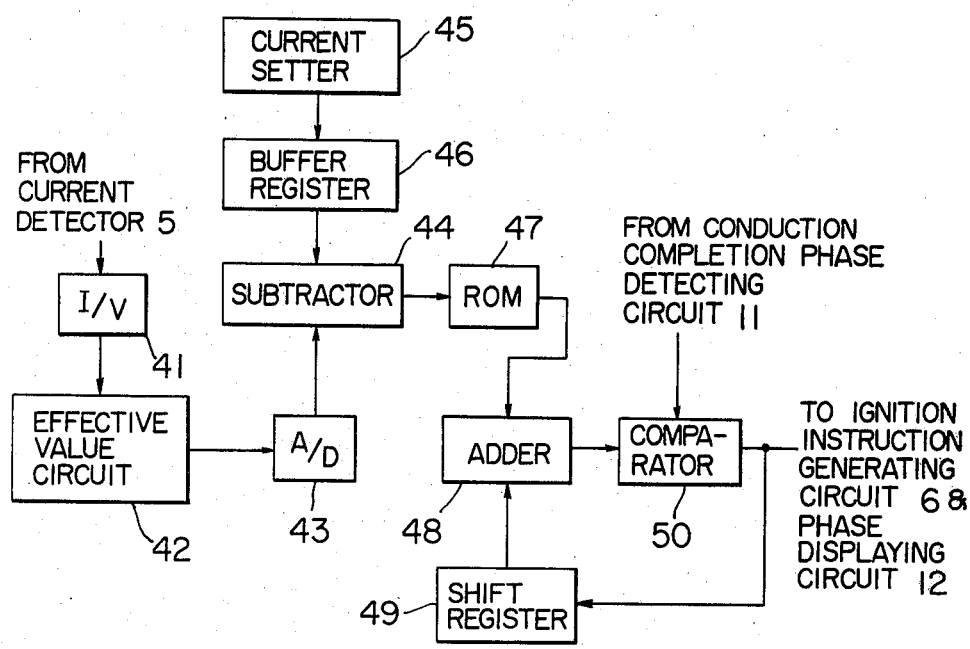
FIGS. 6 through 8 are block diagrams showing detailed constructions of various components of the invention.
Figure 7:
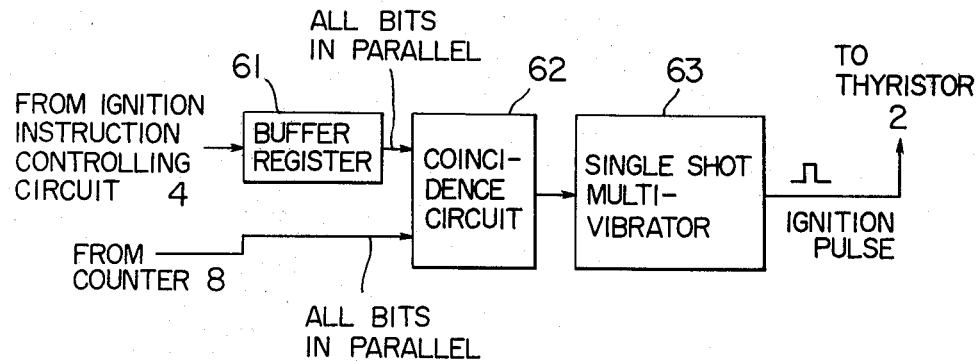
Figure 8:
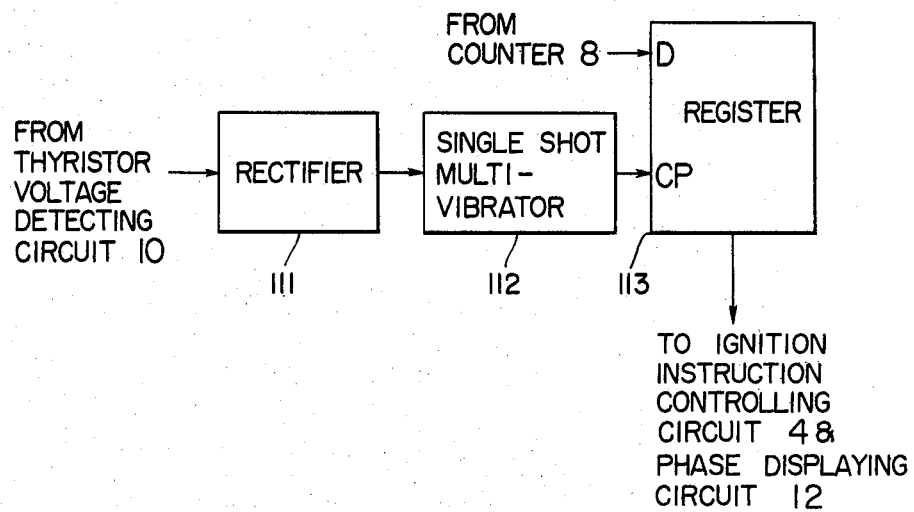

FIGS. 6, 7 and 8 illustrate examples of the aforementioned ignition instruction control circuit (or conduction control circuit) 4, ignition instruction generating circuit 6, and the conduction completion detecting circuit 11, respectively.

In the example of the circuit 4, the output of the current detector 5 of FIG. 1 is applied to a current/voltage converter (I/V) 41. The output of the converter 41 is passed through an effective-value circuit 42 and an A/D converter 43 to a first input of a subtractor 44. On the other hand, a current value set in a current setter 45 is applied through a buffer register 46 to a second input of the subtractor 44. The output of the subtractor 44 representing the difference between the two input signals is then applied to a ROM 47 storing correcting values of the ignition angle of the thyristor, corresponding to various values of the output of the subtractor 44. The output of the ROM 47 is applied to a first input of an adder 48. The output of the adder 48 is applied to a comparator 50 to be compared with the output of the conduction completion phase detecting circuit 11. The greater one of the outputs from the adder 48 and the circuit 11 is delivered from the comparator 50 to the ignition instruction generating circuit 6 and the phase displaying circuit 12 in FIG. 1, while one part of the output of the comparator 50 is delayed in a shift register 49 for one cycle and is applied to a second input of the adder 48.

Figure 4:
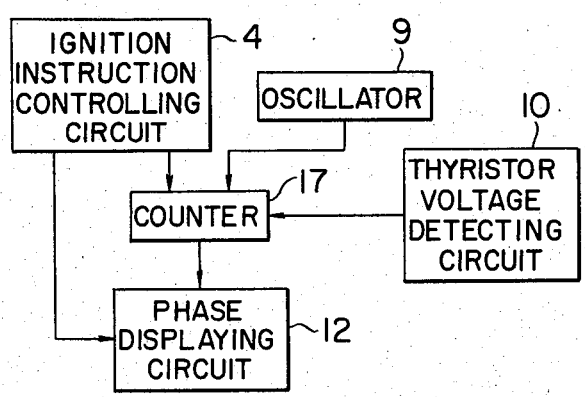

The ignition instruction generating circuit 6 shown in FIG. 7 comprises a coincidence circuit 62 as its principal component. The output of the ignition instruction controlling circuit 4 shown in FIG. 4 is applied through a buffer register 61 to one input of the coincidence circuit 62, while the output of the counter 8 is applied to the other input of the coincidence circuit 62 with all bits in parallel. When the two inputs coincide with each other, a single shot multivibrator 63 is triggered, thereby delivering an ignition pulse to the thyristor 2.

Figure 9:
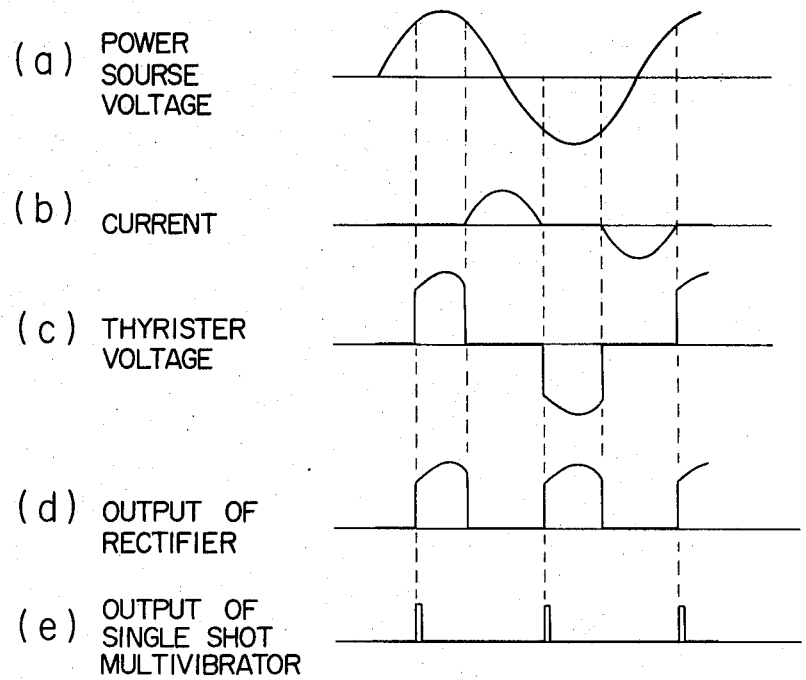
FIGS. 9a–9e are diagrams showing waveforms at various parts in FIG. 8.

In the example of the conduction completion phase detecting circuit 11 shown in FIG. 8, the output from the thyristor voltage detecting circuit 10 as shown in FIG. 9(c) is rectified in a rectifier 111, and the rectified voltage shown in FIG. 9(d) is applied to a single shot multivibrator 112. The output thereof as shown in FIG. 9(e) is applied to a register 113 for latching the count of the counter 8 applied thereto. The register 113 thus provides the conduction completion phase angle at this instant.

Figure 2:
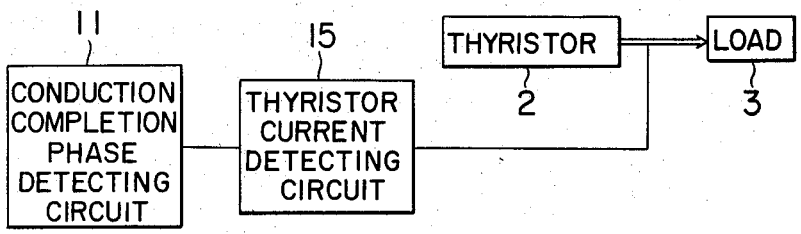
FIGS. 2 through 5 are partial block diagrams showing various other embodiments of the present invention.

In FIG. 2, there is shown another embodiment of the present invention wherein the thyristor voltage detecting circuit 10 in the above described embodiment of FIG. 1 is substituted by an output current detecting circuit 15 which detects the output current supplied through the thyristor 2. Thus, the circuit 15 can detect the completion phase angle of the thyristor conduction by detecting a point where the output current is reduced to zero. Upon detecting the same point, the circuit 15 delivers a conduction completion indicative signal to the thyristor conduction phase detecting circuit 11.

Figure 3:
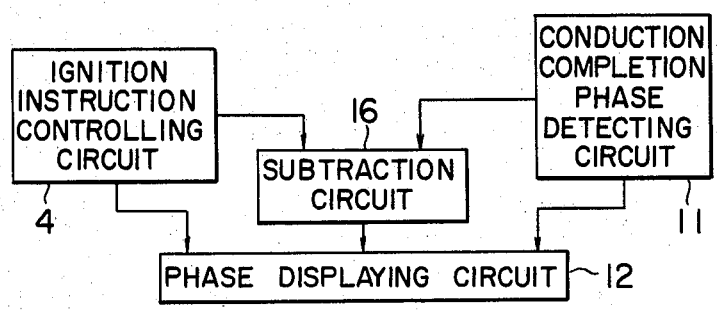

FIG. 3 shows still another embodiment of the invention wherein a subtraction circuit 16 is provided in the preceding stage of the phase displaying circuit 12, thereby providing the difference between the ignition instructing phase angle and the conduction completion phase angle. The difference is displayed to indicate the allowable margin for a forward shift of the ignition phase angle. In this embodiment, if the ignition instruction phase angle is 80° and the conduction completion phase angle is 60°, the difference 80° − 60° = 20° is an input to the phase displaying circuit 12.

Figure 5:
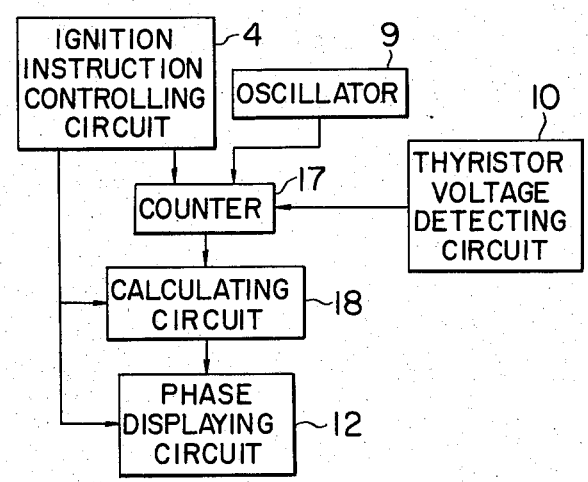

FIGS. 4 and 5 show further embodiments of the present invention. In the embodiment of FIG. 4, a second counter 17 is provided. The counter 17 starts to count the output pulses of the oscillator 9 upon reception of the ignition instruction from the ignition instruction control circuit (or conduction control circuit) 4, and terminates its counting operation upon reception of the conduction completion signal from the thyristor voltage detecting circuit 10. The count of the counter 17 is applied to the phase displaying circuit 12. In this embodiment, the display in the phase displaying circuit 12 corresponds to the conductive period of the thyristor.

The thyristor voltage detecting circuit 10 shown in FIG. 4 may also be substituted by a thyristor output current detecting circuit as shown in FIG. 2, while preserving the same advantageous feature as described with reference to FIG. 2.

In a further embodiment shown in FIG. 5, a calculator 18 is further provided between the counter 17 and the phase displaying circuit 12. When it is assumed that A represents the count of the counter 17 starting from a zero point of the power source voltage to the time of arrival of an ignition instruction, and B represents the count of the same counter 17 starting from the arrival of the ignition instruction to the termination of the conduction of the thyristor, the calculator 18 calculates (A+B) or (A+B−count corresponding to ½ cycle of the power source), thus exhibiting the conduction completion phase angle.

According to the present invention, the ignition phase angle and the conduction completion phase angle of a thyristor (representative of the equiangularly controlled thyristors) are always displayed, and therefore any condition where the ignition phase angle of the thyristor tends to become uncontrollable can be predicted beforehand. When the load is of a variable nature, it is also possible to adjust load with reference to the display, so that the controllable range of the power supply coincides with a desired range.

What is claimed is:

1. In an apparatus for supplying electric power from an AC power source to a load through a thyristor, said apparatus comprising a detector for detecting the voltage of said AC power source, a detector for detecting the current flowing through the thyristor, an oscillator generating a train of pulses, a counter for counting the number of the pulses in said train of pulses in response to an output of said voltage detector, an ignition instruction control circuit responsive to an output of said current detector for delivering a digital output indicative of a required ignition phase angle of the thyristor, and a circuit connected to receive outputs of said counter and said control circuit for delivering an ignition pulse to said thyristor when said outputs coincide with each other, the improvement comprising:

means for detecting the conducting state of said thyristor;

means responsive to an output of said conducting state detecting means for detecting the phase angle of said electric power at which completion of conduction of said thyristor occurs;

means responsive to the digital output of said control circuit and to an output of said phase angle detecting means for converting said outputs into signals indicative of an ignition phase angle and a conduction completion phase angle; and means for displaying said signals indicating said ignition phase angle and said conduction completion phase angle.

2. An apparatus as set forth in claim 1 wherein said conducting state detecting means is a voltage detector which detects voltage across said thyristor.

3. An apparatus as set forth in claim 1 wherein said conducting state detecting means is a current detector which detects current flowing through said thyristor.

4. An apparatus as set forth in claim 2 or 3 wherein said control circuit is responsive to the output of said conduction completion phase angle detecting means and operates to ensure that said ignition phase angle does not lead the conduction completion phase angle of an immediately preceding half cycle of said AC power source.

5. An apparatus as set forth in claim 1 further comprising a subtraction circuit which compares the output of said control circuit with the output of said conduction completion detecting means, thereby providing an output indicative of an allowable margin for a forward shift of the ignition phase angle.

6. In an apparatus for supplying an electric power from an AC power source to a load through a thyristor, said apparatus comprising a detector for detecting the voltage of said AC power source, a detector for detecting the current flowing through the thyristor, an oscillator for generating a train of pulses, a first counter for counting the number of pulses in said train of pulses in response to an output of said voltage detector, an ignition instruction control circuit responsive to an output of said current detector for delivering a digital output indicative of a required ignition phase angle of the thyristor, and a circuit connected to receive outputs of said first counter and said control circuit for delivering an ignition pulse to said thyristor when said outputs coincide with each other, the improvement comprising:

means for detecting the conducting state of said thyristor;

a second counter responsive to the outputs of said ignition instruction control circuit and said conducting state detecting means for starting and stopping a counting operation of the number of pulses in said train of pulses generated from said oscillator, respectively;

means responsive to an output of said second counter and to an output of said control circuit for converting the outputs into a signal indicative of an conductive period of the thyristor; and means for displaying said signal indicating said conductive period.

7. An apparatus as set forth in claim 6 which further comprises a calculating circuit which is connected to receive the output of said second counter and the output of said control circuit for calculating (A+B) or (A+B—the count corresponding to ½ cycle of the power source), where A represents the count of said second counter at the reception of the output of the control circuit, and B represents the count of said second counter indicative of the conduction period of the thyristor.

* * * * *